United States Patent
Huang et al.

(10) Patent No.: US 9,236,278 B2
(45) Date of Patent: Jan. 12, 2016

(54) INTEGRATED CIRCUIT PACKAGING SYSTEM WITH A SUBSTRATE EMBEDDED DUMMY-DIE PADDLE AND METHOD OF MANUFACTURE THEREOF

(75) Inventors: Rui Huang, Singapore (SG); Xusheng Bao, Singapore (SG); Kang Chen, Singapore (SG); Yung Kuan Hsiao, Singapore (SG); Hin Hwa Goh, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 375 days.

(21) Appl. No.: 13/242,306

(22) Filed: Sep. 23, 2011

(65) Prior Publication Data
US 2013/0075922 A1 Mar. 28, 2013

(51) Int. Cl.
| H01L 21/58 | (2006.01) |
| H01L 23/14 | (2006.01) |
| H01L 23/498 | (2006.01) |
| H01L 23/31 | (2006.01) |
| H01L 21/56 | (2006.01) |
| H01L 23/00 | (2006.01) |

(52) U.S. Cl.
CPC .............. *H01L 21/58* (2013.01); *H01L 21/563* (2013.01); *H01L 23/147* (2013.01); *H01L 23/3107* (2013.01); *H01L 23/3128* (2013.01); *H01L 23/49816* (2013.01); *H01L 23/49827* (2013.01); *H01L 24/13* (2013.01); *H01L 24/16* (2013.01); *H01L 24/81* (2013.01); *H01L 24/97* (2013.01); *H01L 2224/16237* (2013.01); *H01L 2224/32225* (2013.01); *H01L 2224/73204* (2013.01); *H01L 2224/814* (2013.01); *H01L 2224/81191* (2013.01); *H01L 2224/81192* (2013.01); *H01L 2224/83104* (2013.01); *H01L 2224/97* (2013.01); *H01L 2924/10253* (2013.01); *H01L 2924/15311* (2013.01)

(58) Field of Classification Search
CPC ................. H01L 2924/00; H01L 2924/00014; H01L 2224/73265; H01L 21/58; H01L 21/563; H01L 21/4832; G02B 6/43
USPC .................... 257/698–778; 361/764; 428/620
See application file for complete search history.

(56) References Cited

U.S. PATENT DOCUMENTS

| 5,175,060 | A | * | 12/1992 | Enomoto et al. ............... 428/620 |
| 6,617,681 | B1 | | 9/2003 | Bohr |
| 6,861,761 | B2 | | 3/2005 | Yang et al. |
| 7,122,906 | B2 | | 10/2006 | Doan |
| 7,279,795 | B2 | | 10/2007 | Periaman et al. |
| 7,327,018 | B2 | | 2/2008 | Chung |
| 7,425,468 | B2 | | 9/2008 | Wang et al. |
| 7,728,439 | B2 | * | 6/2010 | Nishiyama et al. ........... 257/778 |
| 7,842,542 | B2 | | 11/2010 | Shim et al. |
| 7,888,184 | B2 | | 2/2011 | Shim et al. |
| 2001/0009301 | A1 | * | 7/2001 | Azuma ............... H01L 21/4832 257/698 |
| 2002/0144840 | A1 | | 10/2002 | Tzu et al. |
| 2003/0168748 | A1 | * | 9/2003 | Katagiri et al. ............... 257/778 |

(Continued)

*Primary Examiner* — Jerome Jackson, Jr.
*Assistant Examiner* — Fang-Xing Jiang
(74) *Attorney, Agent, or Firm* — Ishimaru & Associates LLP

(57) ABSTRACT

A method of manufacture of an integrated circuit packaging system includes: providing a dummy-die paddle having a first inactive side facing up, a second inactive side facing down; forming an insulator in a single continuous structure around and in direct contact with the first inactive side; and mounting an integrated circuit over the dummy-die paddle and the insulator, the integrated circuit and the dummy-die paddle having the same coefficient of thermal expansion as the dummy-die paddle.

20 Claims, 5 Drawing Sheets

(56) References Cited

U.S. PATENT DOCUMENTS

| | | | | |
|---|---|---|---|---|
| 2006/0012967 A1* | 1/2006 | Asai | ............... | G02B 6/43 361/764 |
| 2008/0302560 A1* | 12/2008 | Tanno | ............... | H01L 21/4853 174/255 |
| 2010/0081236 A1 | 4/2010 | Yang et al. | | |
| 2010/0096738 A1 | 4/2010 | Simmons-Matthews et al. | | |
| 2010/0327424 A1 | 12/2010 | Braunisch et al. | | |
| 2011/0024888 A1 | 2/2011 | Pagaila et al. | | |
| 2011/0101512 A1 | 5/2011 | Choi et al. | | |

* cited by examiner

INTEGRATED CIRCUIT PACKAGING SYSTEM WITH A SUBSTRATE EMBEDDED DUMMY-DIE PADDLE AND METHOD OF MANUFACTURE THEREOF

TECHNICAL FIELD

The present invention relates generally to an integrated circuit packaging system and more particularly to a system for utilizing a substrate and a dummy-die paddle in an integrated circuit packaging system.

BACKGROUND

The rapidly growing market for portable electronic devices, e.g. cellular phones, laptop computers, and PDAs, is an integral facet of modern life. The multitude of portable devices represents one of the largest potential market opportunities for next generation packaging. These devices have unique attributes that have significant impacts on manufacturing integration, in that they must be generally small, light-weight, and rich in functionality and they must be produced in high volumes at relatively low cost.

As an extension of the semiconductor industry, the electronics packaging industry has witnessed ever-increasing commercial competitive pressures, along with growing consumer expectations and the diminishing opportunities for meaningful product differentiation in the marketplace.

Packaging, materials engineering, and development are at the very core of these next generation electronics insertion strategies outlined in road maps for development of next generation products. Future electronic systems can be more intelligent, have higher density, use less power, operate at higher speed, and can include mixed technology devices and assembly structures at lower cost than today.

There have been many approaches to addressing the advanced packaging requirements of microprocessors and portable electronics with successive generations of semiconductors. Many industry road maps have identified significant gaps between the current semiconductor capability and the available supporting electronic packaging technologies. The limitations and issues with current technologies include increasing clock rates, EMI radiation, thermal loads, second level assembly reliability stresses and cost.

As these package systems evolve to incorporate more components with varied environmental needs, the pressure to push the technological envelope becomes increasingly challenging. More significantly, with the ever-increasing complexity, the potential risk of error increases greatly during manufacture.

In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Thus, a need remains for smaller footprints and more robust packages and methods for manufacture. Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system, including: providing a dummy-die paddle having a first inactive side facing up, a second inactive side facing down; forming an insulator in a single continuous structure around and in direct contact with the first inactive side; and mounting an integrated circuit over the dummy-die paddle and the insulator, the integrated circuit and the dummy-die paddle having the same coefficient of thermal expansion as the dummy-die paddle.

The present invention provides an integrated circuit packaging system, including: a dummy-die paddle having a first inactive side facing up, a second inactive side facing down; an insulator in a single continuous structure around and in direct contact with the first inactive side; and an integrated circuit over the dummy-die paddle and the insulator, the integrated circuit and the dummy-die paddle having the same coefficient of thermal expansion as the dummy-die paddle.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
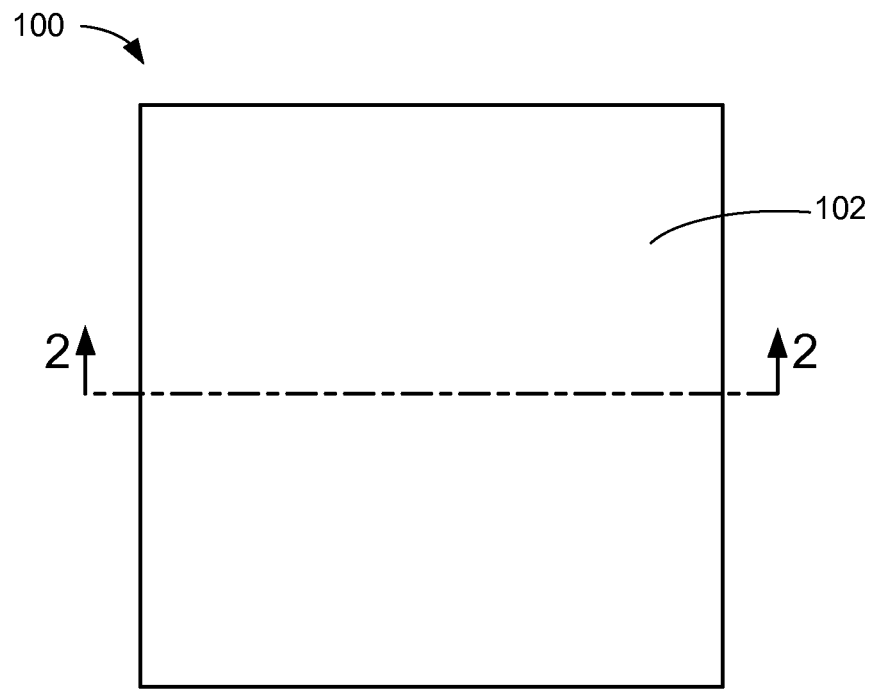
FIG. 1 is a top view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes can be made without departing from the scope of the present invention.

In the following description, numerous specific details are given to provide a thorough understanding of the invention. However, it will be apparent that the invention can be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

In addition, where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the first inactive side of the dummy-die paddle, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements without having any intervening material.

The term "processing" as used herein includes deposition of material or photoresist, patterning, exposure, development, etching, cleaning, and/or removal of the material or photoresist as required in forming a described structure.

Referring now to FIG. 1, therein can be shown a top view of an integrated circuit packaging system 100 in a first embodiment of the present invention. The integrated circuit packaging system 100 can be shown having an encapsulation 102 and can be glob top, film assist molding, or other encasement structure.

The encapsulation 102 can be defined as a structure that protects components from moisture, dust, and other environmental contamination. As an exemplary illustration, the integrated circuit package system 100 can generally be used within a portable electronic device that requires a high level of functional integration and reliability, such as a cellphone or computer.

Figure 2:
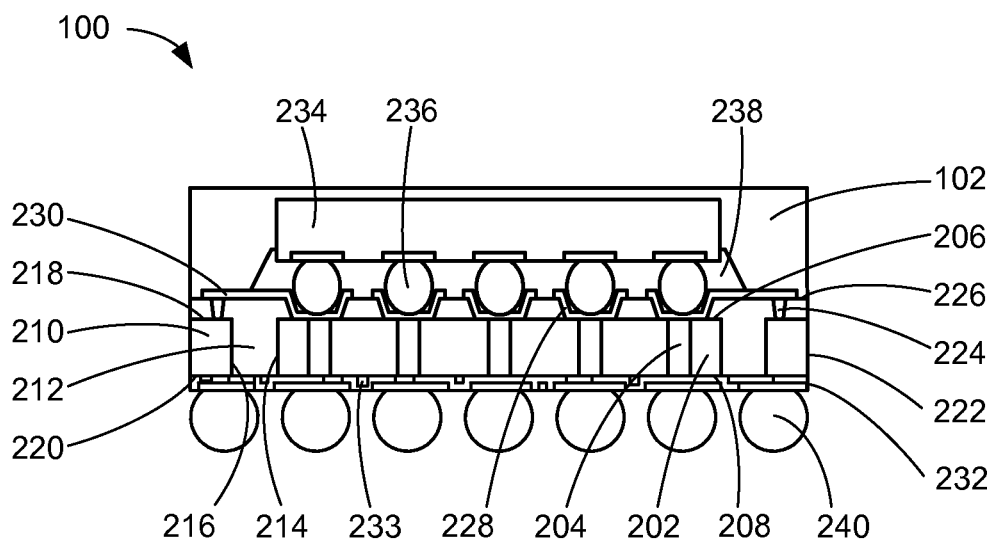
FIG. 2 is a cross-sectional view of the integrated circuit packaging system along the line 2-2 of FIG. 1.

Referring now to FIG. 2, therein can be shown a cross-sectional view of the integrated circuit packaging system 100 along the line 2-2 of FIG. 1. The integrated circuit packaging system 100 can be shown having a dummy-die paddle 202. The dummy-die paddle 202 can be ceramic, silicon, or other material having similar or the same coefficient of thermal expansion as active devices in the integrated circuit packaging system 100. Coefficient of thermal expansion can be defined as the change of relative size per unit of temperature change.

The dummy-die paddle 202 can be shown as a through-silicon-via substrate having through silicon vias 204 traversing the height of the dummy-die paddle 202. The through silicon vias can be a conductive metal like copper or aluminum but can also be a conductive polymer. The dummy-die paddle 202 can be shown having a first inactive side 206 facing up, and a second inactive side 208 facing down. The first inactive side 206 and the second inactive side 208 can be defined as sides of the dummy-die paddle 202 excluding transistor elements or including non-functioning transistor elements.

The dummy-die paddle 202 can be further depicted having pillars 210 peripheral to the dummy-die paddle 202 and distributed around the dummy-die paddle 202. The pillars 210 can be a conductive metal like copper or aluminum but can also be a conductive polymer. The pillars 210 can be defined as conductive structures for transmission of signals.

The pillars 210 can be shown having the same height as the dummy-die paddle 202 and formed around but not touching or contacting the dummy-die paddle 202. The pillars 210 and the dummy-die paddle 202 can be shown having an insulator 212 encapsulating portions of the pillars 210 and the dummy-die paddle 202. The insulator 212 can be an organic polymer, silicon insulator, or other structurally rigid insulating material.

The insulator 212 can be shown covering and in direct contact with outer sides 214 of the dummy-die paddle 202. The outer sides 214 can be vertical and extend from the first inactive side 206 to the second inactive side 208. The outer sides 214 can be shown fully covered by the insulator 212. The insulator 212 can be also shown covering and in direct contact with the first inactive side 206 but not in contact with the second inactive side 208. The second inactive side 208 can be exposed from the insulator 212.

The pillars 210 can be shown having inner sides 216 fully covered by and in direct contact with the insulator 212. The inner sides 216 extend from a top side 218 of the pillars 210 to a bottom side 220 of the pillars 210. The top side 218, the bottom side 220, and the inner sides 216 can be shown as being flat. The top side 218 and the bottom side 220 can be shown terminating in right angles with the inner sides 216.

The top side 218 of the pillars 210 can be shown covered by and in direct contact with the insulator 212. The bottom side 220 can be not in contact with the insulator 212 and can be exposed from the insulator 212. The pillars 210 have exterior sides 222 opposite the inner sides 216 and the exterior sides 222 can be not covered by and can be exposed from the insulator 212. The exterior sides 222 can be exposed to the environment and face away from the dummy-die paddle 202.

The exterior sides 222 can be flat and terminate at right angles with the top side 218 and the bottom side 220, as an example. The inner sides 216 face toward the outer sides 214 of the dummy-die paddle 202.

The insulator 212 does not extend below the pillars 210 or the dummy-die paddle 202 but can be between the pillars 210 and the dummy-die paddle 202 and extends above the pillars 210 and the dummy-die paddle 202 in a single continuous structure. The insulator 212 above the pillars 210 has vias 224 formed through the insulator 212 from a top surface 226 of the insulator 212 to the top side 218 of the pillars 210. The vias 224 can be a metal, a conductive polymer, or a combination thereof filling cavities in the insulator 212. Cavities can expose the pillars 210 from the insulator 212 and can be formed with a laser or by etching.

The insulator 212 above the dummy-die paddle 202 has bonding receptacles 228 formed through the insulator 212 from the top surface 226 of the insulator 212 to the first inactive side 206 of the dummy-die paddle 202. The bonding receptacles 228 can be copper, aluminum, or a combination thereof. The bonding receptacles 228 can be plated on the sides of cavities in the insulator 212. The cavities in the insulator 212 expose the dummy-die paddle 202 from the insulator 212 and can be formed with a laser or by etching.

The insulator 212 has a redistribution layer 230 formed on the top surface 226 and that connects the bonding receptacles 228 and the vias 224. The redistribution layer 230 indirectly electrically connects the dummy-die paddle 202 to the pillars 210 through the bonding receptacles 228 and the vias 224.

The redistribution layer 230 can be defined as a layer fabricated to distribute, route, and channel electrical signals from one contact point to another contact point.

The dummy-die paddle 202 and the pillars 210 have a substrate 232 formed below and in direct contact with the bottom side 220 of the pillars 210 and the second inactive side 208 of the dummy-die paddle 202. The substrate 232 is defined as a structure capable of electrically connection, signal routing and internal isolation, and providing structural support for components to be mounted thereto. The substrate 232 can be but is not limited to laminated plastic or ceramic. The substrate 232 can include a redistribution line for distributing, routing, and channeling electrical signals from one contact point to another contact point and buildup circuits 233 like inductors, capacitors, and resistors.

It has been discovered that utilizing the through-silicon-via substrate as the dummy-die paddle 202 increases the density and number of input output channels increasing the degree of integration. It has further been discovered that utilizing the through-silicon-via substrate as the dummy-die paddle 202 reduces routing distance decreasing parasitic inductance.

The dummy-die paddle 202 can be connected to an integrated circuit 234 with bumps 236 connected in the bonding receptacles 228. The integrated circuit 234 can be directly over the dummy-die paddle 202 with the redistribution layer 230 therebetween. The integrated circuit 234 and the dummy-die paddle 202 have a same or similar coefficient of thermal expansion.

It has been discovered that combining the integrated circuit 234 with the dummy-die paddle 202 having the same or similar coefficient of thermal expansion reduces the coefficient of thermal expansion mismatch with the integrated circuit 234 for increased reliability. It has been further discovered that combining the integrated circuit 234 with the dummy-die paddle 202 having the same or similar coefficient of thermal expansion reduces thermal stress and warpage thereby eliminating or reducing delamination and bump crack while reducing stress at the bumps 236 further increasing reliability.

An under-fill 238 can be below the integrated circuit 234 and around the bumps 236. The under-fill 238 can be defined as a liquid adhesive to control stress on the bumps 236 from vibration, shock, coefficient of thermal expansion mismatch, or seal out moisture and can be applied using a capillary flow process and allowed to wick under the integrated circuit 234.

The integrated circuit 234 can be encapsulated by the encapsulation 102. The encapsulation 102 also encapsulates the redistribution layer 230 and can be in direct contact with the top surface 226 of the insulator 212 and with the under-fill 238. The substrate 232 can be further shown with a ball array 240 mounted below the substrate 232 and below the dummy-die paddle 202 for external connections.

It has been discovered that utilizing the insulator 212 as a single piece above the pillars 210 and the dummy-die paddle 202 reduces cost and allows for efficiency gains during production and reliability gains of the electrical interconnections. It has further been discovered that utilizing the insulator 212 in configured with the dummy-die paddle 202 and the pillars 210 increases the structural rigidity and reliability when coupled with the integrated circuit 234.

Figure 3:
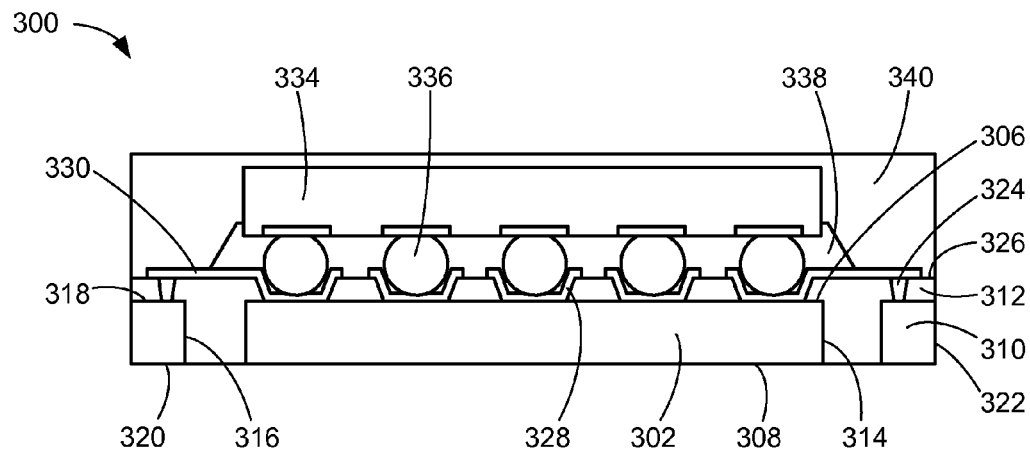
FIG. 3 is a cross-sectional view of an integrated circuit packaging system in a second embodiment of the present invention.

Referring now to FIG. 3, therein can be shown a cross-sectional view of an integrated circuit packaging system 300 in a second embodiment of the present invention. The integrated circuit packaging system 300 can be shown having a dummy-die paddle 302. The dummy-die paddle 302 can be ceramic, silicon, or other material having similar or the same coefficient of thermal expansion as active devices in the integrated circuit packaging system 300. Coefficient of thermal expansion can be defined as the change of relative size per unit of temperature change.

The dummy-die paddle 302 can be shown as a dummy silicon chip. The dummy-die paddle 302 can be shown having a first inactive side 306 facing up, and a second inactive side 308 facing down. The first inactive side 306 and the second inactive side 308 can be defined as sides of the dummy-die paddle 302 excluding transistor elements or including non-functioning transistor elements.

The dummy-die paddle 302 can be further depicted having pillars 310 peripheral to the dummy-die paddle 302 and distributed around the dummy-die paddle 302. The pillars 310 and the vias 224 are outside the perimeter of the integrated circuit 334. The pillars 310 can be a conductive metal like copper or aluminum but can also be a conductive polymer. The pillars 310 can be defined as conductive structures for transmission of signals.

The pillars 310 can be shown having the same height as the dummy-die paddle 302 and formed around but not touching or contacting the dummy-die paddle 302. The pillars 310 and the dummy-die paddle 302 can be shown having an insulator 312 encapsulating portions of the pillars 310 and the dummy-die paddle 302. The insulator 312 can be an organic polymer, silicon insulator, or other structurally rigid insulating material.

The insulator 312 can be shown covering and in direct contact with outer sides 314 of the dummy-die paddle 302. The outer sides 314 can be vertical and extend from the first inactive side 306 to the second inactive side 308. The outer sides 314 can be shown fully covered by the insulator 312. The insulator 312 can be also shown covering and in direct contact with the first inactive side 306 but not in contact with the second inactive side 308. The second inactive side 308 can be exposed from the insulator 312 and exposed to the environment.

The pillars 310 can be shown having inner sides 316 fully covered by and in direct contact with the insulator 312. The inner sides 316 extend from a top side 318 of the pillars 310 to a bottom side 320 of the pillars 310. The top side 318, the bottom side 320, and the inner sides 316 can be shown as being flat. The top side 318 and the bottom side 320 can be shown terminating in right angles with the inner sides 316.

The top side 318 of the pillars 310 can be shown covered by and in direct contact with the insulator 312. The bottom side 320 can be not in contact with the insulator 312 and can be exposed from the insulator 312 and exposed to the environment. The pillars 310 have exterior sides 322 opposite the inner sides 316 and the exterior sides 322 can be not covered by and can be exposed from the insulator 312 and exposed to the environment. The exterior sides 322 can be exposed to the environment and face away from the dummy-die paddle 302.

The exterior sides 322 can be flat and terminate at right angles with the top side 318 and the bottom side 320, as an example. The inner sides 316 face toward the outer sides 314 of the dummy-die paddle 302.

The insulator 312 does not extend below the pillars 310 or the dummy-die paddle 302 but can be between the pillars 310 and the dummy-die paddle 302 and extends above the pillars 310 and the dummy-die paddle 302 in a single continuous structure. The insulator 312 above the pillars 310 has vias 324 formed through the insulator 312 from a top surface 326 of the insulator 312 to the top side 318 of the pillars 310. The vias 324 can be a metal, a conductive polymer, or a combination thereof filling cavities in the insulator 312. Cavities can expose the pillars 310 from the insulator 312 and can be formed with a laser or by etching.

The insulator 312 above the dummy-die paddle 302 has bonding receptacles 328 formed through the insulator 312 from the top surface 326 of the insulator 312 to the first inactive side 306 of the dummy-die paddle 302. The bonding receptacles 328 can be copper, aluminum, or a combination thereof. The bonding receptacles 328 can be plated on the sides of cavities in the insulator 312. The cavities in the insulator 312 expose the dummy-die paddle 302 from the insulator 312 and can be formed with a laser or by etching.

The insulator 312 has a redistribution layer 330 formed on the top surface 326 and that connects the bonding receptacles 328 and the vias 324. The redistribution layer 330 indirectly electrically connects the dummy-die paddle 302 to the pillars 310 through the bonding receptacles 328 and the vias 324. The redistribution layer 330 can be defined as a layer fabricated to distribute, route, and channel electrical signals from one contact point to another contact point.

The dummy-die paddle 302 can be connected to an integrated circuit 334 with bumps 336 connected in the bonding receptacles 328. The integrated circuit 334 can be directly over the dummy-die paddle 302 with the redistribution layer 330 therebetween. The integrated circuit 334 and the dummy-die paddle 302 have a same or similar coefficient of thermal expansion.

It has been discovered that combining the integrated circuit 334 with the dummy-die paddle 302 having the same or similar coefficient of thermal expansion reduces the coefficient of thermal expansion mismatch with the integrated circuit 334 increasing reliability. It has been further discovered that combining the integrated circuit 334 with the dummy-die paddle 302 having the same or similar coefficient of thermal expansion reduces thermal stress and warpage thereby eliminating or reducing delamination and bump crack while reducing stress at the bumps 336 further increasing reliability.

An under-fill 338 can be below the integrated circuit 334 and around the bumps 336. The under-fill 338 can be defined as a liquid adhesive to control stress on the bumps 336 from vibration, shock, coefficient of thermal expansion mismatch, or seal out moisture and can be applied using a capillary flow process and allowed to wick under the integrated circuit 334.

The integrated circuit 334 can be encapsulated by an encapsulation 340 and can be glob top, film assist molding, or other encasement structure. The encapsulation 340 can be defined as a structure that protects components from moisture, dust, and other environmental contamination. The encapsulation 340 also encapsulates the redistribution layer 330 and can be in direct contact with the top surface 326 of the insulator 312 and with the under-fill 338.

It has been discovered that utilizing the insulator 312 as a single piece above the pillars 310 and the dummy-die paddle 302 reduces cost and allows for efficiency gains during production and reliability gains of the electrical interconnections. It has further been discovered that utilizing the insulator 312 in configured with the dummy-die paddle 302 and the pillars 310 increases the structural rigidity and reliability when coupled with the integrated circuit 334.

Figure 4:
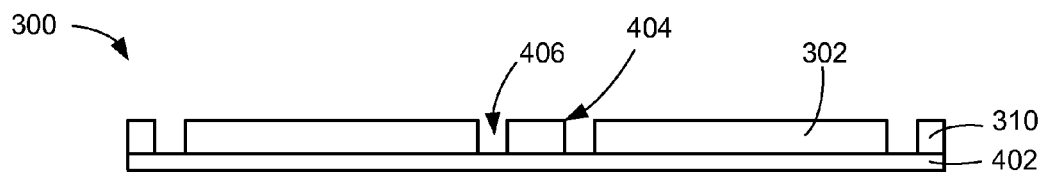
FIG. 4 is the integrated circuit packaging system of FIG. 3 after a pillar mounting phase of manufacture.

Referring now to FIG. 4, therein can be shown the integrated circuit packaging system 300 of FIG. 3 after a pillar mounting phase of manufacture. The integrated circuit packaging system 300 can be shown having a temporary carrier 402 provided to support the dummy-die paddle 302 and a lead frame 404 having the pillars 310 over the temporary carrier 402. The pillars 310 can be shown mounted on the temporary carrier 402 peripheral and adjacent to the dummy-die paddle 302 with space 406 therebetween.

Figure 5:
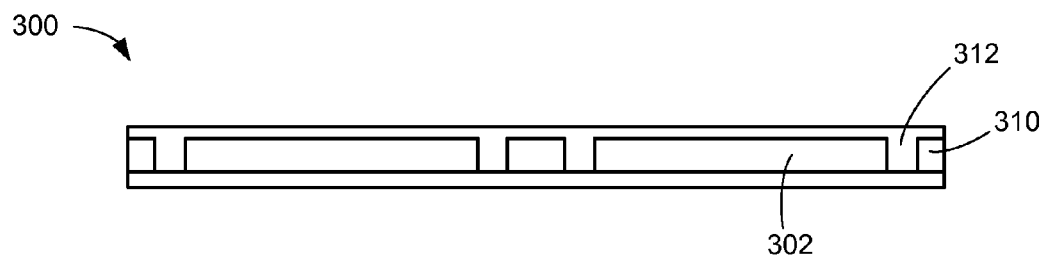
FIG. 5 is the structure of FIG. 4 after an insulation molding phase of manufacture.

Referring now to FIG. 5, therein can be shown the structure 300 of FIG. 4 after an insulation molding phase of manufacture. The integrated circuit packaging system 300 can be shown having the insulator 312 molded in a single piece between the dummy-die paddle 302 and the pillars 310. The insulator 312 can be further shown molded above the dummy-die paddle 302 and the pillars 310.

Figure 6:
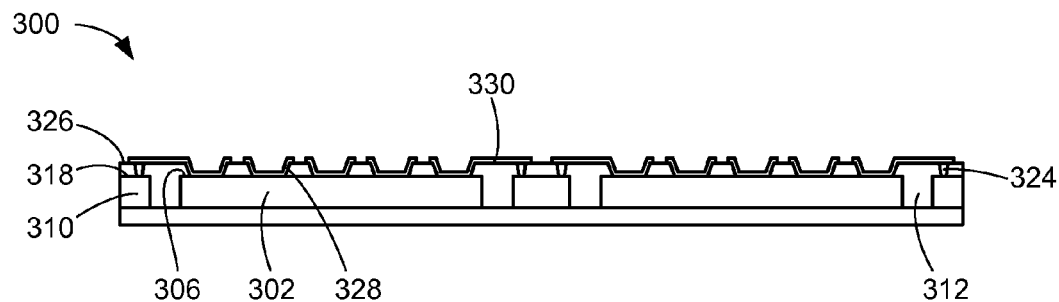
FIG. 6 is the structure of FIG. 5 after a redistribution layer formation phase of manufacture.

Referring now to FIG. 6, therein can be shown the structure 300 of FIG. 5 after a redistribution layer formation phase of manufacture. The integrated circuit packaging system 300 can be shown having the vias 324 formed through the insulator 312 from the top surface 326 of the insulator 312 to the top side 318 of the pillars 310. The vias 324 can be a metal, a conductive polymer, or a combination thereof filling cavities in the insulator 312. Cavities can expose the pillars 310 from the insulator 312 and can be formed with a laser or by etching.

The insulator 312 above the dummy-die paddle 302 has the bonding receptacles 328 formed through the insulator 312 from the top surface 326 of the insulator 312 to the first inactive side 306 of the dummy-die paddle 302. The bonding receptacles 328 can be copper, aluminum, or a combination thereof. The bonding receptacles 328 can be plated on the sides of cavities in the insulator 312. The cavities in the insulator 312 expose the dummy-die paddle 302 from the insulator 312 and can be formed with a laser or by etching.

The insulator 312 has the redistribution layer 330 formed on the top surface 326 and connects to the bonding receptacles 328 and the vias 324. Each of the bonding receptacles 328 can be routed to the pillars 310 that correspond to signals transmitted via the redistribution layer 330. The pillars 310 can be arranged to surround the entire perimeter of the dummy-die paddle 302 and correspond to the bonding receptacles 328 covering the entire first inactive side 306 as an array. The redistribution layer 330 indirectly electrically connects the dummy-die paddle 302 to the pillars 310 through the bonding receptacles 328 and the vias 324.

Figure 7:
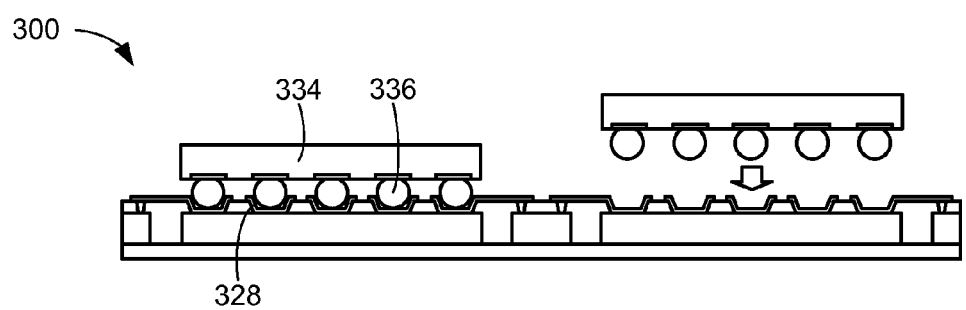
FIG. 7 is the structure of FIG. 6 during a die attach phase of manufacture.

Referring now to FIG. 7, therein can be shown the structure 300 of FIG. 6 during a die attach phase of manufacture. The integrated circuit packaging system 300 can be shown having the integrated circuit 334 mounted to the bonding receptacles 328 with the bumps 336 fitted within the bonding receptacles 328.

Figure 8:
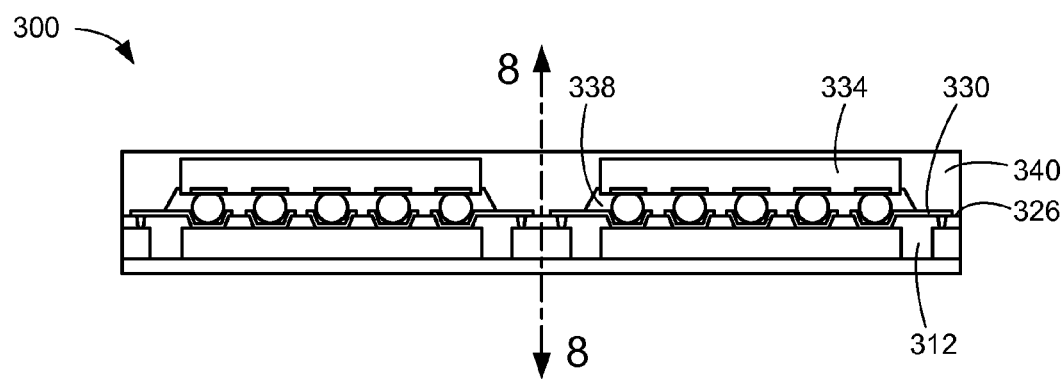
FIG. 8 is the structure of FIG. 7 after an encapsulation phase of manufacture.

Referring now to FIG. 8, therein can be shown the structure 300 of FIG. 7 after an encapsulation phase of manufacture. The integrated circuit packaging system 300 can be shown having the integrated circuit 334 encapsulated by the encapsulation 340. The encapsulation 340 also encapsulates the redistribution layer 330 and can be in direct contact with the top surface 326 of the insulator 312 and with the under-fill 338. A singulation line 8-8 can be also depicted as the place where the integrated circuit packaging system 300 will be singulated in a separate process.

Figure 9:
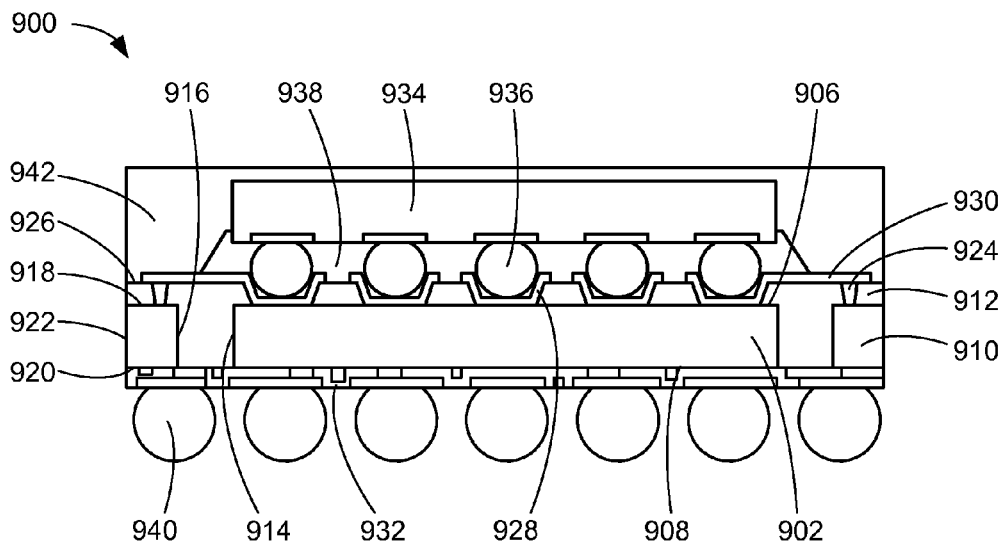
FIG. 9 is a cross-sectional view of an integrated circuit packaging system in a third embodiment of the present invention.

Referring now to FIG. 9, therein can be shown a cross-sectional view of an integrated circuit packaging system 900 in a third embodiment of the present invention. The integrated circuit packaging system 900 can be shown having a dummy-die paddle 902. The dummy-die paddle 902 can be ceramic, silicon, or other material having similar or the same coefficient of thermal expansion as active devices in the integrated circuit packaging system 900. Coefficient of thermal expansion can be defined as the change of relative size per unit of temperature change.

The dummy-die paddle 902 can be shown as a dummy silicon chip. The dummy-die paddle 902 can be shown having a first inactive side 906 facing up, and a second inactive side 908 facing down. The first inactive side 906 and the second inactive side 908 can be defined as sides of the dummy-die paddle 902 excluding transistor elements or including non-functioning transistor elements.

The dummy-die paddle 902 can be further depicted having pillars 910 peripheral to the dummy-die paddle 902 and distributed around the dummy-die paddle 902. The pillars 910 can be a conductive metal like copper or aluminum but can also be a conductive polymer. The pillars 910 can be defined as conductive structures for transmission of signals.

The pillars 910 can be shown having the same height as the dummy-die paddle 902 and formed around but not touching or contacting the dummy-die paddle 902. The pillars 910 and the dummy-die paddle 902 can be shown having an insulator 912 encapsulating portions of the pillars 910 and the dummy-die paddle 902. The insulator 912 can be an organic polymer, silicon insulator, or other structurally rigid insulating material.

The insulator 912 can be shown covering and in direct contact with outer sides 914 of the dummy-die paddle 902. The outer sides 914 can be vertical and extend from the first inactive side 906 to the second inactive side 908. The outer sides 914 can be shown fully covered by the insulator 912. The insulator 912 can be also shown covering and in direct contact with the first inactive side 906 but not in contact with the second inactive side 908. The second inactive side 908 can be exposed from the insulator 912.

The pillars 910 can be shown having inner sides 916 fully covered by and in direct contact with the insulator 912. The inner sides 916 extend from a top side 918 of the pillars 910 to a bottom side 920 of the pillars 910. The top side 918, the bottom side 920, and the inner sides 916 can be shown as being flat. The top side 918 and the bottom side 920 can be shown terminating in right angles with the inner sides 916.

The top side 918 of the pillars 910 can be shown covered by and in direct contact with the insulator 912. The bottom side 920 can be not in contact with the insulator 912 and can be exposed from the insulator 912. The pillars 910 have exterior sides 922 opposite the inner sides 916 and the exterior sides 922 can be not covered by and can be exposed from the insulator 912. The exterior sides 922 can be exposed to the environment and face away from the dummy-die paddle 902.

The exterior sides 922 can be flat and terminate at right angles with the top side 918 and the bottom side 920, as an example. The inner sides 916 face toward the outer sides 914 of the dummy-die paddle 902.

The insulator 912 does not extend below the pillars 910 or the dummy-die paddle 902 but can be between the pillars 910 and the dummy-die paddle 902 and extends above the pillars 910 and the dummy-die paddle 902 in a single continuous structure. The insulator 912 above the pillars 910 has vias 924 formed through the insulator 912 from a top surface 926 of the insulator 912 to the top side 918 of the pillars 910. The vias 924 can be a metal, a conductive polymer, or a combination thereof filling cavities in the insulator 912. Cavities can expose the pillars 910 from the insulator 912 and can be formed with a laser or by etching.

The insulator 912 above the dummy-die paddle 902 has bonding receptacles 928 formed through the insulator 912 from the top surface 926 of the insulator 912 to the first inactive side 906 of the dummy-die paddle 902. The bonding receptacles 928 can be copper, aluminum, or a combination thereof. The bonding receptacles 928 can be plated on the sides of cavities in the insulator 912. The cavities in the insulator 912 expose the dummy-die paddle 902 from the insulator 912 and can be formed with a laser or by etching.

The insulator 912 has a redistribution layer 930 formed on the top surface 926 and that connects the bonding receptacles 928 and the vias 924. The redistribution layer 930 indirectly electrically connects the dummy-die paddle 902 to the pillars 910 through the bonding receptacles 928 and the vias 924.

The redistribution layer 930 can be defined as a layer fabricated to distribute, route, and channel electrical signals from one contact point to another contact point.

The dummy-die paddle 902 and the pillars 910 have a substrate 932 formed below and in direct contact with the bottom side 920 of the pillars 910 and the second inactive side 908 of the dummy-die paddle 902. The substrate 932 is defined as a structure capable of electrically connection, signal routing and internal isolation, and providing structural support for components to be mounted thereto. The substrate 932 can be but is not limited to laminated plastic or ceramic. The substrate 932 can include a redistribution line for distributing, routing, and channeling electrical signals from one contact point to another contact point and buildup circuits like inductors, capacitors, and resistors.

The dummy-die paddle 902 can be connected to an integrated circuit 934 with bumps 936 connected in the bonding receptacles 928. The integrated circuit 934 can be directly over the dummy-die paddle 902 with the redistribution layer 930 therebetween. The integrated circuit 934 and the dummy-die paddle 902 have a same or similar coefficient of thermal expansion.

It has been discovered that combining the integrated circuit 934 with the dummy-die paddle 902 having the same or similar coefficient of thermal expansion reduces the coefficient of thermal expansion mismatch with the integrated circuit 934 increasing reliability. It has been further discovered that combining the integrated circuit 934 with the dummy-die paddle 902 having the same or similar coefficient of thermal expansion reduces thermal stress and warpage thereby eliminating or reducing delamination and bump crack while reducing stress at the bumps 936 further increasing reliability.

An under-fill 938 can be below the integrated circuit 934 and around the bumps 936. The under-fill 938 can be defined as a liquid adhesive to control stress on the bumps 936 from vibration, shock, coefficient of thermal expansion mismatch, or seal out moisture and can be applied using a capillary flow process and allowed to wick under the integrated circuit 934.

The integrated circuit 934 can be encapsulated by an encapsulation 942 and can be glob top, film assist molding, or other encasement structure. The encapsulation 942 can be defined as a structure that protects components from moisture, dust, and other environmental contamination. The encapsulation 942 also encapsulates the redistribution layer 930 and can be in direct contact with the top surface 926 of the insulator 912 and with the under-fill 938. The substrate 932 can be further shown with a ball array 940 mounted below the substrate 932 and below the dummy-die paddle 902 for external connections.

It has been discovered that utilizing the insulator 912 as a single piece above the pillars 910 and the dummy-die paddle 902 reduces cost and allows for efficiency gains during production and reliability gains of the electrical interconnections. It has further been discovered that utilizing the insulator 912 in configured with the dummy-die paddle 902 and the pillars 910 increases the structural rigidity and reliability when coupled with the integrated circuit 934.

Figure 10:
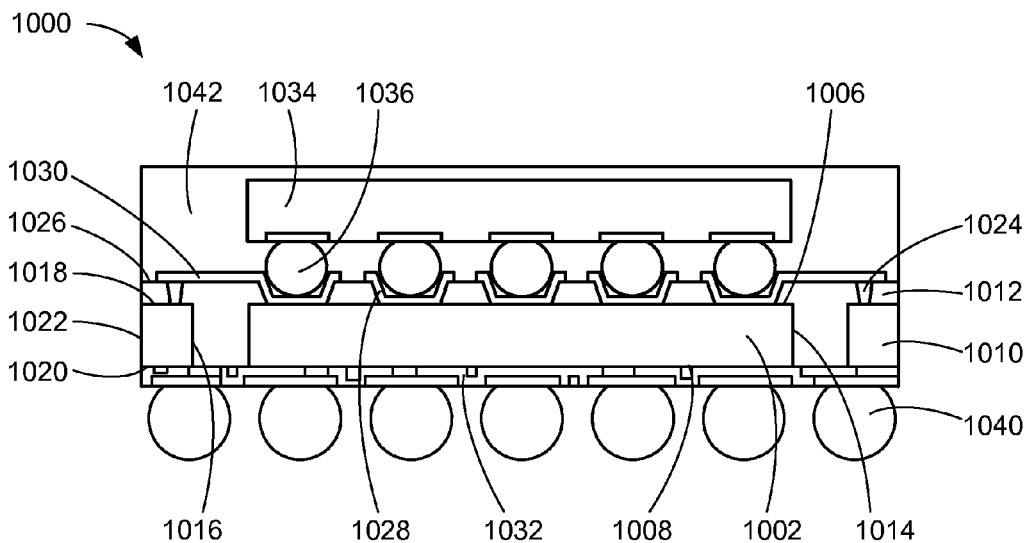
FIG. 10 is a cross-sectional view of an integrated circuit packaging system in a fourth embodiment of the present invention.

Referring now to FIG. 10, therein can be shown a cross-sectional view of an integrated circuit packaging system 1000 in a fourth embodiment of the present invention. The integrated circuit packaging system 1000 can be shown having a dummy-die paddle 1002. The dummy-die paddle 1002 can be ceramic, silicon, or other material having similar or the same coefficient of thermal expansion as active devices in the integrated circuit packaging system 1000. Coefficient of thermal expansion can be defined as the change of relative size per unit of temperature change.

The dummy-die paddle 1002 can be shown as a dummy silicon chip. The dummy-die paddle 1002 can be shown having a first inactive side 1006 facing up, and a second inactive side 1008 facing down. The first inactive side 1006 and the second inactive side 1008 can be defined as sides of the dummy-die paddle 1002 excluding transistor elements or including non-functioning transistor elements.

The dummy-die paddle 1002 can be further depicted having pillars 1010 peripheral to the dummy-die paddle 1002 and distributed around the dummy-die paddle 1002. The pillars 1010 can be a conductive metal like copper or aluminum but can also be a conductive polymer. The pillars 1010 can be defined as conductive structures for transmission of signals.

The pillars 1010 can be shown having the same height as the dummy-die paddle 1002 and formed around but not touching or contacting the dummy-die paddle 1002. The pillars 1010 and the dummy-die paddle 1002 can be shown having an insulator 1012 encapsulating portions of the pillars 1010 and the dummy-die paddle 1002. The insulator 1012 can be an organic polymer, silicon insulator, or other structurally rigid insulating material.

The insulator 1012 can be shown covering and in direct contact with outer sides 1014 of the dummy-die paddle 1002. The outer sides 1014 can be vertical and extend from the first inactive side 1006 to the second inactive side 1008. The outer sides 1014 can be shown fully covered by the insulator 1012. The insulator 1012 can be also shown covering and in direct contact with the first inactive side 1006 but not in contact with the second inactive side 1008. The second inactive side 1008 can be exposed from the insulator 1012.

The pillars 1010 can be shown having inner sides 1016 fully covered by and in direct contact with the insulator 1012. The inner sides 1016 extend from a top side 1018 of the pillars 1010 to a bottom side 1020 of the pillars 1010. The top side 1018, the bottom side 1020, and the inner sides 1016 can be shown as being flat. The top side 1018 and the bottom side 1020 can be shown terminating in right angles with the inner sides 1016.

The top side 1018 of the pillars 1010 can be shown covered by and in direct contact with the insulator 1012. The bottom side 1020 can be not in contact with the insulator 1012 and can be exposed from the insulator 1012. The pillars 1010 have exterior sides 1022 opposite the inner sides 1016 and the exterior sides 1022 can be not covered by and can be exposed from the insulator 1012. The exterior sides 1022 can be exposed to the environment and face away from the dummy-die paddle 1002.

The exterior sides 1022 can be flat and terminate at right angles with the top side 1018 and the bottom side 1020, as an example. The inner sides 1016 face toward the outer sides 1014 of the dummy-die paddle 1002.

The insulator 1012 does not extend below the pillars 1010 or the dummy-die paddle 1002 but can be between the pillars 1010 and the dummy-die paddle 1002 and extends above the pillars 1010 and the dummy-die paddle 1002 in a single continuous structure. The insulator 1012 above the pillars 1010 has vias 1024 formed through the insulator 1012 from a top surface 1026 of the insulator 1012 to the top side 1018 of the pillars 1010. The vias 1024 can be a metal, a conductive polymer, or a combination thereof filling cavities in the insulator 1012. Cavities can expose the pillars 1010 from the insulator 1012 and can be formed with a laser or by etching.

The insulator 1012 above the dummy-die paddle 1002 has bonding receptacles 1028 formed through the insulator 1012 from the top surface 1026 of the insulator 1012 to the first inactive side 1006 of the dummy-die paddle 1002. The bonding receptacles 1028 can be copper, aluminum, or a combination thereof. The bonding receptacles 1028 can be plated on the sides of cavities in the insulator 1012. The cavities in the insulator 1012 expose the dummy-die paddle 1002 from the insulator 1012 and can be formed with a laser or by etching.

The insulator 1012 has a redistribution layer 1030 formed on the top surface 1026 and that connects the bonding receptacles 1028 and the vias 1024. The redistribution layer 1030 indirectly electrically connects the dummy-die paddle 1002 to the pillars 1010 through the bonding receptacles 1028 and the vias 1024. The redistribution layer 1030 can be defined as a layer fabricated to distribute, route, and channel electrical signals from one contact point to another contact point.

The dummy-die paddle 1002 and the pillars 1010 have a substrate 1032 formed below and in direct contact with the bottom side 1020 of the pillars 1010 and the second inactive side 1008 of the dummy-die paddle 1002. The substrate 1032 is defined as a structure capable of electrically connection, signal routing and internal isolation, and providing structural support for components to be mounted thereto. The substrate 1032 can be but is not limited to laminated plastic or ceramic. The substrate 1032 can include a redistribution line for distributing, routing, and channeling electrical signals from one contact point to another contact point and buildup circuits like inductors, capacitors, and resistors.

The dummy-die paddle 1002 can be connected to an integrated circuit 1034 with bumps 1036 connected in the bonding receptacles 1028. The integrated circuit 1034 can be directly over the dummy-die paddle 1002 with the redistribution layer 1030 therebetween. The integrated circuit 1034 and the dummy-die paddle 1002 have a same or similar coefficient of thermal expansion.

It has been discovered that combining the integrated circuit 1034 with the dummy-die paddle 1002 having the same or similar coefficient of thermal expansion reduces the coefficient of thermal expansion mismatch with the integrated circuit 1034 increasing reliability. It has been further discovered that combining the integrated circuit 1034 with the dummy-die paddle 1002 having the same or similar coefficient of thermal expansion reduces thermal stress and warpage thereby eliminating or reducing delamination and bump crack while reducing stress at the bumps 1036 further increasing reliability.

The integrated circuit 1034 can be encapsulated by an encapsulation 1042 and can be glob top, film assist molding, or other encasement structure. The encapsulation 1042 can be defined as a structure that protects components from moisture, dust, and other environmental contamination. The encapsulation 1042 also encapsulates the redistribution layer 1030 and can be in direct contact with the top surface 1026 of the insulator 1012. The substrate 1032 can be further shown with a ball array 1040 mounted below the substrate 1032 and below the dummy-die paddle 1002 for external connections.

It has been discovered that combining the integrated circuit 1034 with the dummy-die paddle 1002 having the same or similar coefficient of thermal expansion eliminates the need for an under-fill below the integrated circuit 1034 and around the bumps 1036. Eliminating the need for an under-fill allows the encapsulation 1042 to be utilized to fill under the integrated circuit 1034 and around the bumps 1036 without risk of stress caused breakage of the bumps 1036.

It has been discovered that utilizing the insulator 1012 as a single piece above the pillars 1010 and the dummy-die paddle 1002 reduces cost and allows for efficiency gains during production and reliability gains of the electrical interconnections. It has further been discovered that utilizing the insulator 1012 in configured with the dummy-die paddle 1002 and the pillars 1010 increases the structural rigidity and reliability when coupled with the integrated circuit 1034.

Figure 11:
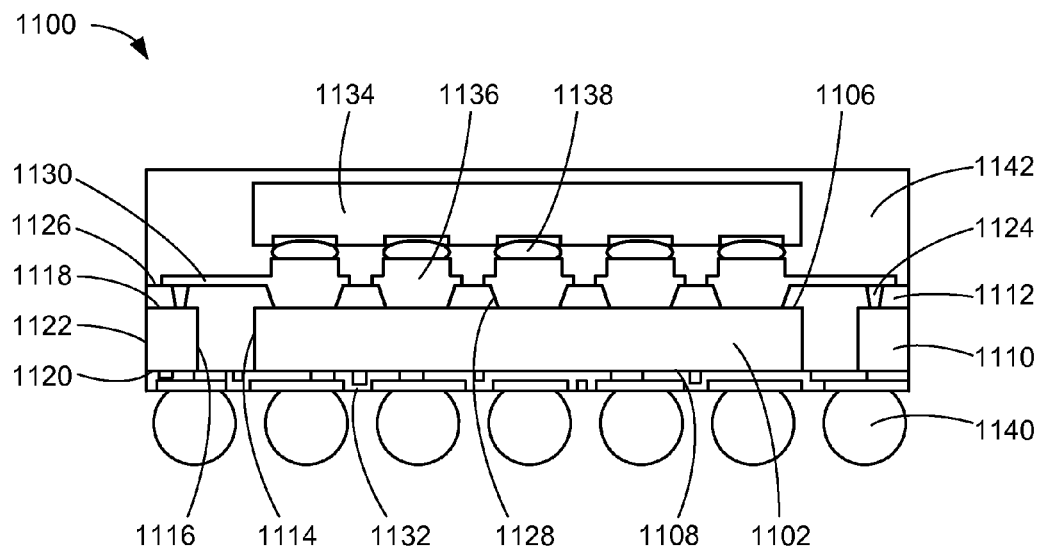
FIG. 11 is a cross-sectional view of an integrated circuit packaging system in a fifth embodiment of the present invention.

Referring now to FIG. 11, therein can be shown a cross-sectional view of an integrated circuit packaging system 1100 in a fifth embodiment of the present invention. The integrated circuit packaging system 1100 can be shown having a dummy-die paddle 1102. The dummy-die paddle 1102 can be ceramic, silicon, or other material having similar or the same coefficient of thermal expansion as active devices in the integrated circuit packaging system 1100. Coefficient of thermal expansion can be defined as the change of relative size per unit of temperature change.

The dummy-die paddle 1102 can be shown as a dummy silicon chip. The dummy-die paddle 1102 can be shown having a first inactive side 1106 facing up, and a second inactive side 1108 facing down. The first inactive side 1106 and the second inactive side 1108 can be defined as sides of the dummy-die paddle 1102 excluding transistor elements or including non-functioning transistor elements.

The dummy-die paddle 1102 can be further depicted having pillars 1110 peripheral to the dummy-die paddle 1102 and distributed around the dummy-die paddle 1102. The pillars 1110 can be a conductive metal like copper or aluminum but can also be a conductive polymer. The pillars 1110 can be defined as conductive structures for transmission of signals.

The pillars 1110 can be shown having the same height as the dummy-die paddle 1102 and formed around but not touching or contacting the dummy-die paddle 1102. The pillars 1110 and the dummy-die paddle 1102 can be shown having an insulator 1112 encapsulating portions of the pillars 1110 and the dummy-die paddle 1102. The insulator 1112 can be an organic polymer, silicon insulator, or other structurally rigid insulating material.

The insulator 1112 can be shown covering and in direct contact with outer sides 1114 of the dummy-die paddle 1102. The outer sides 1114 can be vertical and extend from the first inactive side 1106 to the second inactive side 1108. The outer sides 1114 can be shown fully covered by the insulator 1112. The insulator 1112 can be also shown covering and in direct contact with the first inactive side 1106 but not in contact with the second inactive side 1108. The second inactive side 1108 can be exposed from the insulator 1112.

The pillars 1110 can be shown having inner sides 1116 fully covered by and in direct contact with the insulator 1112. The inner sides 1116 extend from a top side 1118 of the pillars 1110 to a bottom side 1120 of the pillars 1110. The top side 1118, the bottom side 1120, and the inner sides 1116 can be shown as being flat. The top side 1118 and the bottom side 1120 can be shown terminating in right angles with the inner sides 1116.

The top side 1118 of the pillars 1110 can be shown covered by and in direct contact with the insulator 1112. The bottom side 1120 can be not in contact with the insulator 1112 and can be exposed from the insulator 1112. The pillars 1110 have exterior sides 1122 opposite the inner sides 1116 and the exterior sides 1122 can be not covered by and can be exposed from the insulator 1112. The exterior sides 1122 can be exposed to the environment and face away from the dummy-die paddle 1102.

The exterior sides 1122 can be flat and terminate at right angles with the top side 1118 and the bottom side 1120, as an example. The inner sides 1116 face toward the outer sides 1114 of the dummy-die paddle 1102.

The insulator 1112 does not extend below the pillars 1110 or the dummy-die paddle 1102 but can be between the pillars 1110 and the dummy-die paddle 1102 and extends above the pillars 1110 and the dummy-die paddle 1102 in a single continuous structure. The insulator 1112 above the pillars 1110 has vias 1124 formed through the insulator 1112 from a top surface 1126 of the insulator 1112 to the top side 1118 of the pillars 1110. The vias 1124 can be a metal, a conductive polymer, or a combination thereof filling cavities in the insulator 1112. Cavities can expose the pillars 1110 from the insulator 1112 and can be formed with a laser or by etching.

The insulator 1112 above the dummy-die paddle 1102 has bonding receptacles 1128 formed through the insulator 1112 from the top surface 1126 of the insulator 1112 to the first inactive side 1106 of the dummy-die paddle 1102. The bonding receptacles 1128 can be copper, aluminum, or a combination thereof. The bonding receptacles 1128 can be plated on the sides of cavities in the insulator 1112. The cavities in the insulator 1112 expose the dummy-die paddle 1102 from the insulator 1112 and can be formed with a laser or by etching.

The insulator 1112 has a redistribution layer 1130 formed on the top surface 1126 and that connects the bonding receptacles 1128 and the vias 1124. The redistribution layer 1130 indirectly electrically connects the dummy-die paddle 1102 to the pillars 1110 through the bonding receptacles 1128 and the vias 1124. The redistribution layer 1130 can be defined as a layer fabricated to distribute, route, and channel electrical signals from one contact point to another contact point.

The dummy-die paddle 1102 and the pillars 1110 have a substrate 1132 formed below and in direct contact with the bottom side 1120 of the pillars 1110 and the second inactive side 1108 of the dummy-die paddle 1102. The substrate 1132 is defined as a structure capable of electrically connection, signal routing and internal isolation, and providing structural support for components to be mounted thereto. The substrate 1132 can be but is not limited to laminated plastic or ceramic. The substrate 1132 can include a redistribution line for distributing, routing, and channeling electrical signals from one contact point to another contact point and buildup circuits like inductors, capacitors, and resistors.

The dummy-die paddle 1102 can be connected to an integrated circuit 1134 with posts 1136 connected in the bonding receptacles 1128. The posts 1136 can be a conductive metal like copper or aluminum but can also be a conductive polymer. The posts 1136 can be defined as a conductive structure for vertical transmission of signals.

The integrated circuit 1134 can be directly over the dummy-die paddle 1102 with the redistribution layer 1130 therebetween. The integrated circuit 1134 and the dummy-die paddle 1102 have a same or similar coefficient of thermal expansion. The integrated circuit 1134 can be a low-k device having a low dielectric constant. The integrated circuit 1134 can be connected to the posts 1136 with a solder cap 1138 that acts as a stress buffer between the integrated circuit 1134 and the posts 1136 to prevent damage to interlayer dielectric layers (not shown) within the integrated circuit 1134.

It has been discovered that combining the integrated circuit 1134 with the dummy-die paddle 1102 having the same or similar coefficient of thermal expansion reduces the coefficient of thermal expansion mismatch with the integrated circuit 1134 increasing reliability. It has been further discovered that combining the integrated circuit 1134 with the dummy-die paddle 1102 having the same or similar coefficient of thermal expansion reduces thermal stress and warpage thereby eliminating or reducing delamination and bump crack while reducing stress at the posts 1136 further increasing reliability.

The integrated circuit 1134 can be encapsulated by an encapsulation 1142 and can be glob top, film assist molding, or other encasement structure. The encapsulation 1142 can be defined as a structure that protects components from moisture, dust, and other environmental contamination. The encapsulation 1142 also encapsulates the redistribution layer 1130 and can be in direct contact with the top surface 1126 of the insulator 1112. The substrate 1132 can be further shown with a ball array 1140 mounted below the substrate 1132 and below the dummy-die paddle 1102 for external connections.

It has been discovered that combining the integrated circuit 1134 with the dummy-die paddle 1102 having the same or similar coefficient of thermal expansion eliminates the need for an under-fill below the integrated circuit 1134 and around the posts 1136. Eliminating the need for an under-fill allows the encapsulation 1142 to be utilized to fill under the integrated circuit 1134 and around the posts 1136 without risk of stress caused breakage of the posts 1136.

It has been discovered that utilizing the insulator 1112 as a single piece above the pillars 1110 and the dummy-die paddle 1102 reduces cost and allows for efficiency gains during production and reliability gains of the electrical interconnections. It has further been discovered that utilizing the insulator 1112 in configured with the dummy-die paddle 1102 and the pillars 1110 increases the structural rigidity and reliability when coupled with the integrated circuit 1134.

Figure 12:
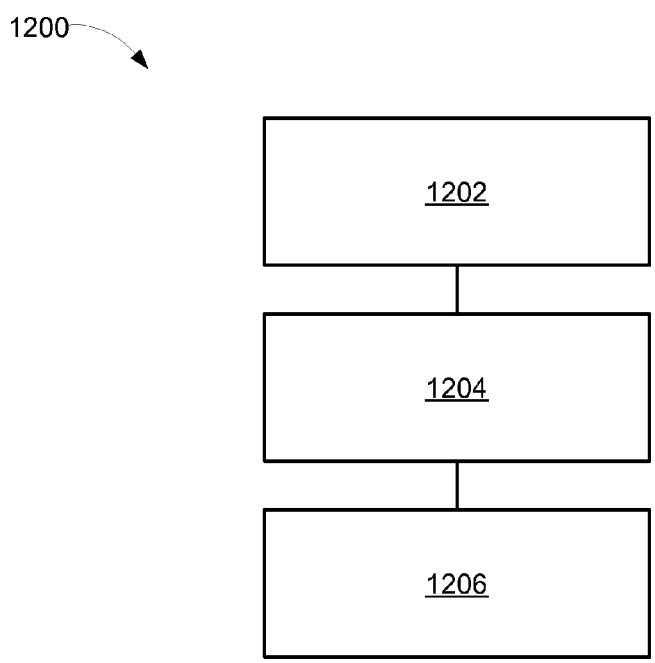
FIG. 12 is a flow chart of a method of manufacture of the integrated circuit packaging system in a further embodiment of the present invention.

Referring now to FIG. 12, therein can be shown a flow chart of a method 1200 of manufacture of the integrated circuit packaging system in a further embodiment of the present invention. The method 1200 includes: providing a dummy-die paddle having a first inactive side facing up, a second inactive side facing down in a block 1202; forming an insulator in a single continuous structure around and in direct contact with the first inactive side in a block 1204; and mounting an integrated circuit over the dummy-die paddle and the insulator, the integrated circuit and the dummy-die paddle having the same coefficient of thermal expansion as the dummy-die paddle in a block 1206.

Thus, it has been discovered that the integrated circuit packaging system and embedded dummy-die paddle of the present invention furnishes important and heretofore unknown and unavailable solutions, capabilities, and functional aspects for integrated circuit packaging system configurations. The resulting processes and configurations are straightforward, cost-effective, uncomplicated, highly versatile, accurate, sensitive, and effective, and can be implemented by adapting known components for ready, efficient, and economical manufacturing, application, and utilization.

Another important aspect of the present invention is that it valuably supports and services the historical trend of reducing costs, simplifying systems, and increasing performance. These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
providing a dummy-die paddle having a first inactive side facing up, a second inactive side facing down, and pillars being peripheral to the dummy-die paddle;
forming an insulator, wherein the insulator is between and in direct contact with outer sides of the dummy-die paddle and inner sides of the pillars, and on top and in direct contact with the first inactive side of the dummy-die paddle and top sides of the pillars, the insulator has vias through the insulator on the pillars; and
mounting an integrated circuit over the dummy-die paddle and the insulator, the pillars and the vias outside the perimeter of the integrated circuit, and the integrated circuit having the same coefficient of thermal expansion as the dummy-die paddle.

2. The method as claimed in claim 1 wherein providing the dummy-die paddle includes providing the dummy-die paddle having a through via traversing the height of the dummy-die paddle.

3. The method as claimed in claim 1 wherein forming the insulator includes forming the insulator exposing the second inactive side from the insulator.

4. The method as claimed in claim 1 further comprising filling an under-fill between the integrated circuit and the insulator.

5. The method as claimed in claim 1 further comprising forming a substrate in direct contact with the second inactive side.

6. A method of manufacture of an integrated circuit packaging system comprising:
providing a temporary carrier;
mounting a dummy-die paddle on the temporary carrier having:
a first inactive side facing up,
a second inactive side facing down, and
outer sides terminating at the first inactive side and the second inactive side;
mounting a lead frame with a pillar peripheral to the dummy-die paddle, and having:
a top side on a top, and
an exterior side terminating at the top side;
forming an insulator, wherein the insulator is between and in direct contact with the outer sides of the dummy-die paddle and inner sides of the pillars, and on top and in direct contact with the first inactive side of the dummy-die paddle and top sides of the pillars, the insulator has vias through the insulator on the pillars, and mold around the pillars in direct contact with the top side;
mounting an integrated circuit over the dummy-die paddle and the insulator, the pillars and the vias outside the perimeter of the integrated circuit, and the integrated circuit having the same coefficient of thermal expansion as the dummy-die paddle; and
removing the temporary carrier.

7. The method as claimed in claim 6 further comprising forming vias through the insulator from the top surface of the insulator to the top side of the pillar.

8. The method as claimed in claim 6 wherein forming the insulator includes forming the insulator exposing the exterior side from the insulator.

9. The method as claimed in claim 6 further comprising:
forming a post over the dummy-die paddle;
forming a solder cap above the post; and
wherein:
mounting the integrated circuit includes electrically connecting the integrated circuit to the solder cap and the post.

10. The method as claimed in claim 6 further comprising forming a redistribution layer on the top surface of the insulator.

11. An integrated circuit packaging system comprising:
a dummy-die paddle having a first inactive side facing up, a second inactive side facing down, and pillars being peripheral to the dummy-die paddle;
an insulator, wherein the insulator is between and in direct contact with outer sides of the dummy-die paddle and inner sides of the pillars, and on top and in direct contact with the first inactive side of the dummy-die paddle and top sides of the pillars, the insulator has vias through the insulator on the pillars;
an integrated circuit over the dummy-die paddle and the insulator, the pillars and the vias outside the perimeter of the integrated circuit and the integrated circuit having the same coefficient of thermal expansion as the dummy-die paddle.

12. The system as claimed in claim 11 wherein the dummy-die paddle having a through via traversing the height of the dummy-die paddle.

13. The system as claimed in claim 11 wherein the second inactive side is exposed from the insulator.

14. The system as claimed in claim 11 further comprising an under-fill filled between the integrated circuit and the insulator.

15. The system as claimed in claim 11 further comprising a substrate in direct contact with the second inactive side.

16. The system as claimed in claim 11 further comprising a pillar mounted peripheral to the dummy-die paddle, and each pillar including:
a top side on a top; and
an exterior side terminating at the top side.

17. The system as claimed in claim 16 further comprising through the insulator from the top surface of the insulator to the top side of the pillar.

18. The system as claimed in claim 16 wherein the exterior side is exposed from the insulator.

19. The system as claimed in claim 16 further comprising:
a post over the dummy-die paddle;
a solder cap above the post; and
wherein:
the integrated circuit is electrically connected to the solder cap and the post.

20. The system as claimed in claim 16 further comprising a redistribution layer on the top surface of the insulator.

* * * * *